United States Patent [19]
de Boisriou

[11] Patent Number: 5,524,171
[45] Date of Patent: Jun. 4, 1996

[54] DEVICE FOR THE PROCESSING AND PRE-CORRECTION OF AN AUDIO SIGNAL BEFORE IT IS AMPLIFIED IN AN AMPLIFICATION SYSTEM OF A TRANSMITTER WITH AMPLITUDE MODULATION

[75] Inventor: Philippe de Boisriou, Paris, France

[73] Assignee: Thomson-CSF, Puteaux, France

[21] Appl. No.: 65,906

[22] Filed: May 25, 1993

[30] Foreign Application Priority Data

Jun. 5, 1992 [FR] France .................. 92 06863

[51] Int. Cl.$^6$ .................................. G10L 9/00
[52] U.S. Cl. ............... 395/2.36; 395/2.35; 395/2.74
[58] Field of Search ................... 395/2, 2.1, 2.25, 395/2.29, 2.35, 2.36, 2.28, 2.31, 2.32, 2.74; 381/46, 47, 46, 47

[56] References Cited

U.S. PATENT DOCUMENTS

| | | | |
|---|---|---|---|
| 4,121,165 | 10/1978 | Dogliotti et al. | 329/50 |
| 4,227,046 | 10/1980 | Nakajima et al. | 381/47 |
| 4,752,596 | 6/1988 | Sluijter | 381/47 |
| 4,775,901 | 10/1988 | Nakano | 360/60 |
| 4,851,934 | 7/1989 | Takeuchi et al. | 360/64 |
| 4,922,539 | 5/1990 | Rajasekaran et al. | 381/50 |
| 5,323,329 | 6/1994 | Keane | 364/492 |

OTHER PUBLICATIONS

Kreyszy, "Advanced Engineering Mathematics", pp. 774–775. (1979).

Advanced Engineering Mathematics, 1979, E. Kreyszy, pp. 774–775, "Interpolation." Advanced Engineering Mathematics, Oct. 8–11, 1984, pp. 1–14, M. Sandler, "Towards A Digital Power Amplifier."

*Primary Examiner*—Allen R. MacDonald
*Assistant Examiner*—Michael A. Sartori
*Attorney, Agent, or Firm*—Oblon, Spivak, McClelland, Maier & Neustadt

[57] ABSTRACT

A device for carrying out a pre-correction of audio signals before they are amplified in amplification systems of transmitters with amplitude modulation, the amplification systems each having a determined number of modules generating pulses of modulated width. This device includes:

an analog-digital converter for converting the audio signal to be transmitted into digital samples;

an interpolation circuit coupled to the output of the analog-digital converter to carry out the computation, by a linear interpolation, of the slope of variation and the computation, by a parabolic interpolation, of the value of the audio signal applied to the input of the analog-digital converter;

and memory means coupled to the output of the interpolation circuit storing pre-correction values of the samples of the audio signal addressable by means of the interpolation values of the audio signal computed by the interpolation circuit.

4 Claims, 4 Drawing Sheets

5,524,171

DEVICE FOR THE PROCESSING AND PRE-CORRECTION OF AN AUDIO SIGNAL BEFORE IT IS AMPLIFIED IN AN AMPLIFICATION SYSTEM OF A TRANSMITTER WITH AMPLITUDE MODULATION

BACKGROUND OF THE INVENTION

1. Field of the Invention

The present invention relates to a device for the processing and pre-correction of an audio signal before it is amplified in an amplification system of a transmitter with amplitude modulation.

It can be applied notably to the making of transmitters with amplitude modulation, comprising pulse-width modulation systems.

2. Description of the Prior Art

In these transmitters, the audio signal is converted into digital samples to be applied as described in the French patent No. 84 10806 (2 567 338), to a logic unit for the control of modules that generate pulses of modulated width, said modules being series-connected to the input of a filter. The control logic unit associates the modules in series as a function of the amplitude of digital samples applied to the control logic unit in order to reconstitute the modulation signal at the output of the filter. However, since the pulse-generating modules are formed by current-chopping semiconductor devices, a distortion of the audio signal appears at the output of the filter. This distortion is due chiefly to the switch-over frequency of the generating modules, and this distortion produces parasitic lines in the audio spectrum transmitted. To attenuate this distortion, the switch-over frequency of the generating modules is chosen so as to be relatively high with respect to the frequency of the audio signal and the sampling and digitization frequencies of the audio signal are determined so as to be higher than the switch-over frequency of the modules. However, these arrangements prove to be insufficient, and there is always a fairly substantial distortion, especially for the high rates of modulation.

The aim of the invention is to overcome the above-mentioned drawbacks.

SUMMARY OF THE INVENTION

To this end, an object of the invention is a device for the processing and pre-correction of an audio signal before it is amplified in an amplification system of a transmitter with amplitude modulation, the amplification system comprising a determined number of modules generating pulses of modulated width, said modules being series-connected to the input of a filter, wherein said device comprises:

an analog-digital converter to convert the audio signal to be transmitted into digital samples;

an interpolation circuit coupled to the output of the analog-digital converter to carry out respectively the computation, by a linear interpolation, of the slope of variation and the computation, by a parabolic interpolation, of the value of the audio signal applied to the input of the analog-digital converter;

memory means coupled to the output of the interpolation circuit for storing pre-correction values of the samples of the audio signal addressable by means of the interpolation values of the audio signal computed by the interpolation circuit.

The device according to the invention has the advantage wherein it enables an increase in the apparent frequency of digitization of the audio signal with a pre-correction by which the rate of audiofrequency distortion at the output of the transmitter can be reduced.

BRIEF DESCRIPTION OF THE DRAWINGS

Other features and advantages of the invention shall appear here below from the following description, made with reference to the appended drawings, of which.

DETAILED DESCRIPTION OF THE PREFERRED EMBODIMENTS

Figure 1:
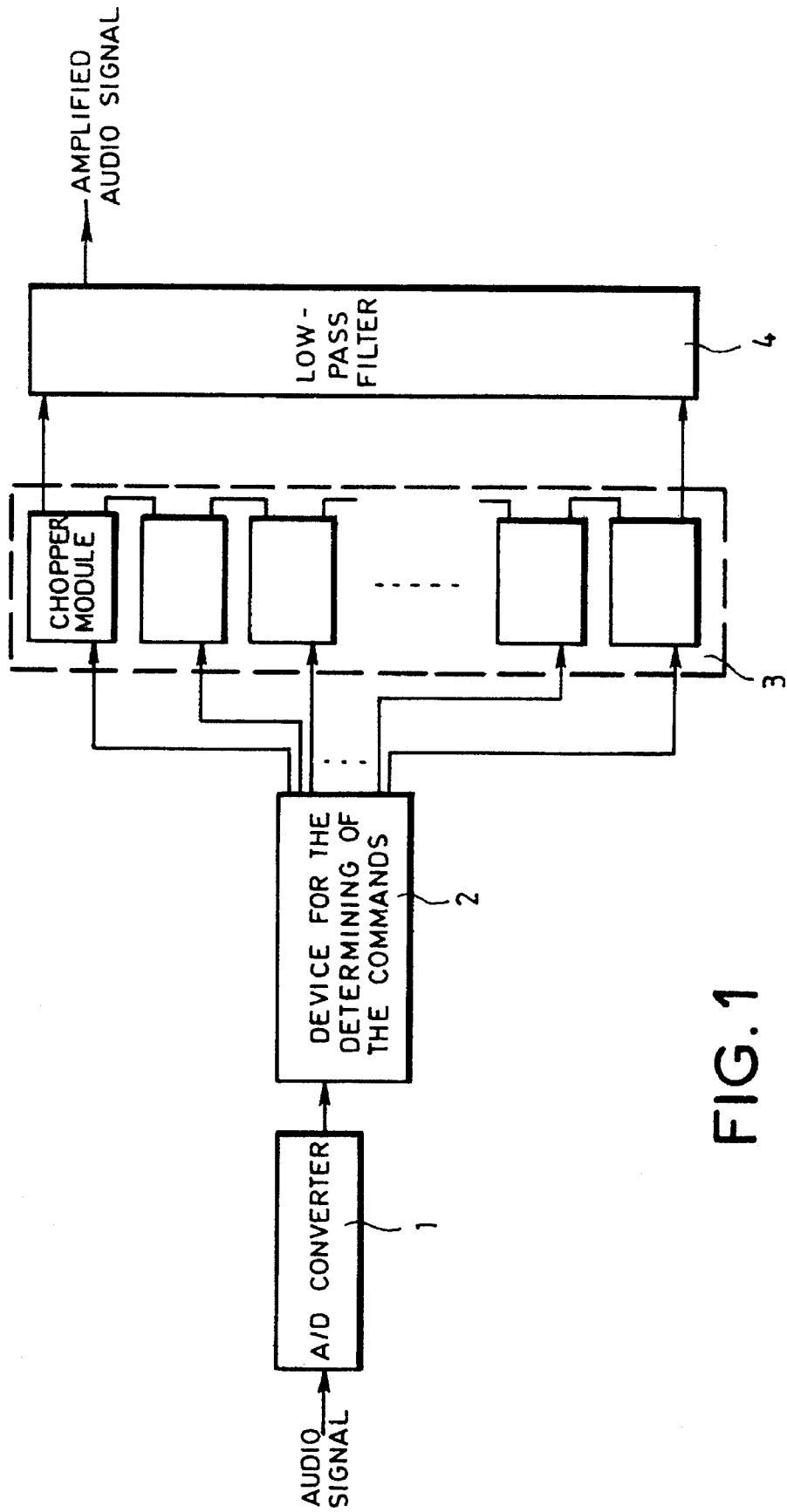
FIGS. 1 and 2 show two embodiments of amplification systems of transmitters with pulse-generating modules.
Figure 2:
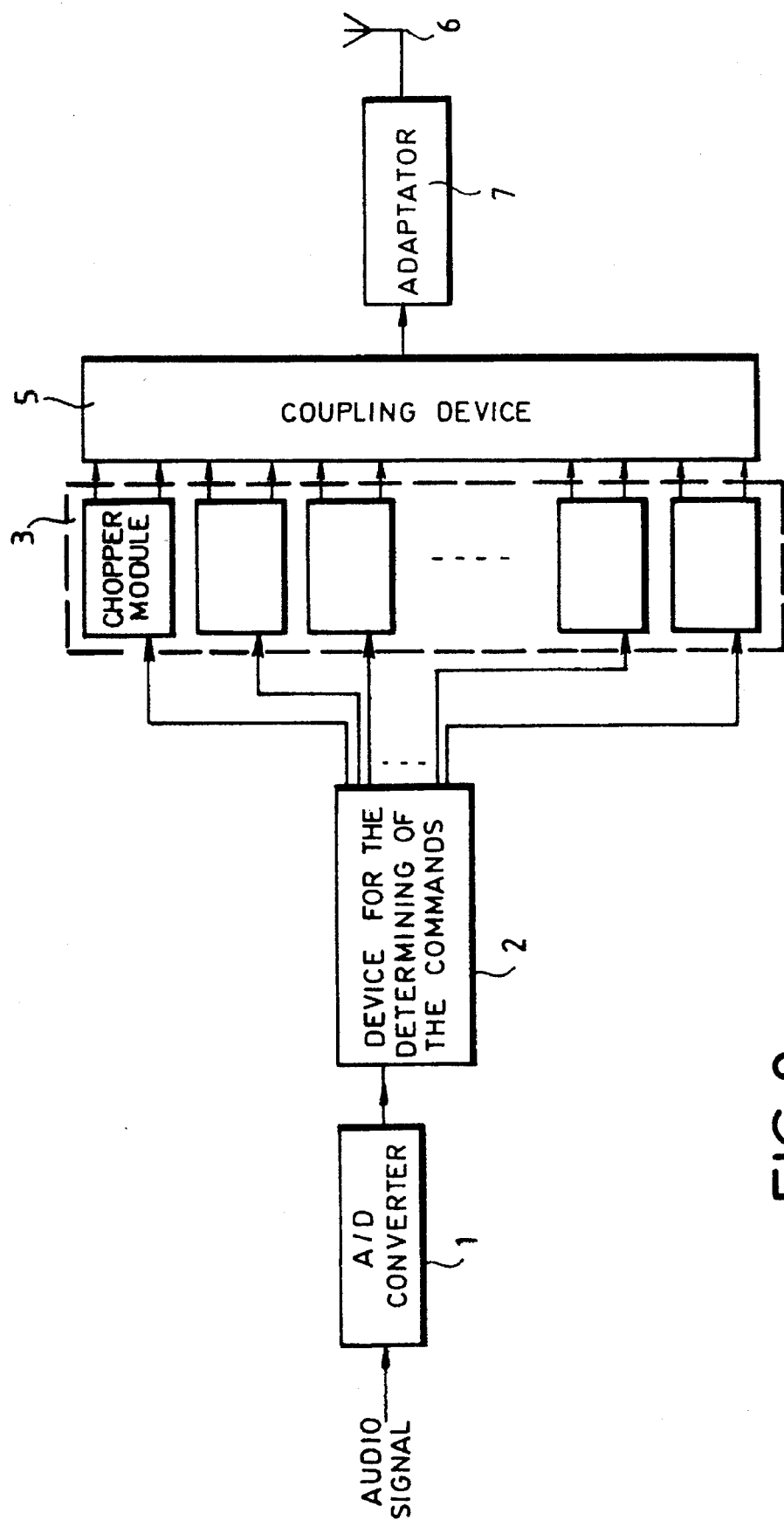

The transmission unit with pulse-generating modules, shown in FIG. 1, comprises an analog-digital converter 1 coupled by its output to a device 2 for the determining of commands, the outputs of which are connected to pulse-generating modules 3, series-connected to a low-pass filter 4. In this embodiment, the audio signal is applied to the input of the analog-digital converter 1. The samples obtained are processed in the device 2 for determining commands. This device 2 gives a command to each pulse-generating is module 3. The signal at output of the modules 3 filtered so that the audio signal is reconstituted by the low-pass filter 4, and applied to the RF stage of the transmitter (not shown). In the transmission unit using semiconductor-based RF amplification stages that is shown in FIG. 2, where the elements similar to those of FIG. 1 are shown with the same references, the outputs of the modules 3 are coupled by a coupling device 5 to a transmission antenna 6 by means of an adaptor 7.

Figure 3:
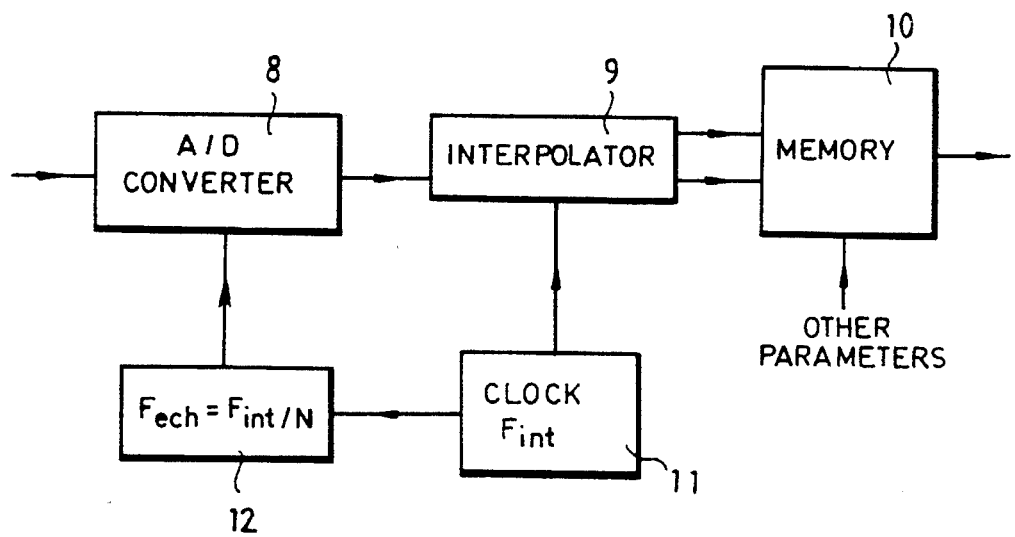
FIG. 3 shows an embodiment of the device for the processing and pre-correction of an audio signal according to the invention.

According to the invention, the processing and pre-correction device shown in FIG. 3 takes the place of the analog-digital converter 1 to apply values of pre-corrected samples to the device 2 for the determining of commands. This device has an analog-digital converter 8 coupled to an interpolation device 9 connected to address inputs of a correction memory 10. A clock 11 applies synchronization signals to the interpolation device 9 and to a frequency dividing counter 12 to give a sampling frequency for the analog-digital converter 8. According to this arrangement, the audio signal that is applied to the input of the analog-digital converter 8 is converted into digital samples at a frequency which may be lower than the switch-over frequency of the semiconductor-based stage 3 of the amplification systems shown in FIGS. 1 and 2. Using $U_n$ to designate the sequence of values given by the analog-digital converter 8 and Fech to designate the sampling frequency obtained by division, by a determined number N, of the frequency given by the clock 11 to the interpolation device 9 and to the counter 12, the interpolation device 9 computes:

mean values $v_n$ between the current sample and the preceding sample according to the relationship:

$$V_n = (U_{n-1} + U_n)/2$$

a difference value $P_n$ between the value of the current sample $U_n$ and the value of the preceding sample $U_{n-1}$;

as well as a the value $a_n$ which verifies relationships:

$$P_{n+1} = P_n + N \cdot a_n$$

and $$V_n = V_{n-1} + N \cdot P_n + (N-1) \cdot N/2 \cdot a_n$$

During each sampling period Tech=1/Fech, the interpolation circuit 9 genes N values $P_n$ and $V_n$ such that:

$$P_n(i) = P_n \cdot i \cdot a_n$$

$$V_n(i) = V_n \cdot i \cdot P_n + (i-1) \cdot i/2 \cdot a_n$$

The sequence of the values $P_n$ is equivalent to a linear interpolation of the slope of variation of the audio signal and the sequence of the values $V_n$ corresponds to a parabolic interpolation of the value of the audio signal applied to the input of the analog-digital converter 1.

Figure 4:
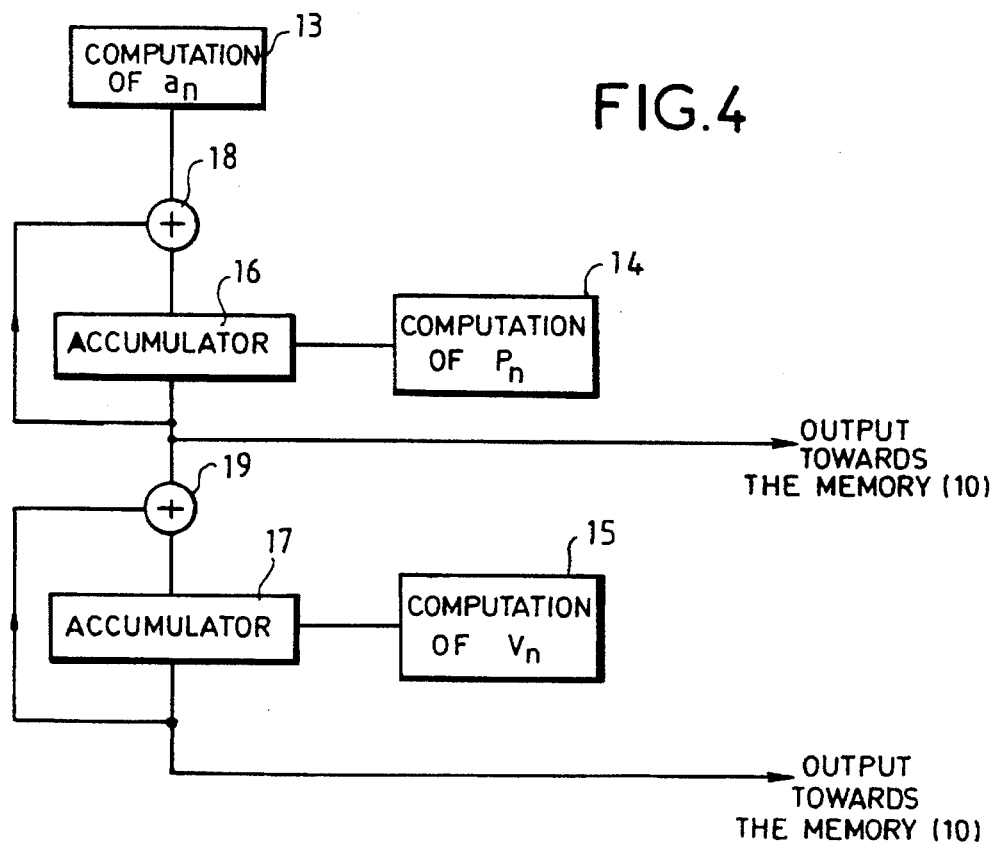
FIG. 4 shows an embodiment of the interpolation circuit of FIG. 3.

At each sampling period, the values $a_n$, $P_n$ and $V_n$ are computed respectively by computation devices 13, 14 and 15 shown in FIG. 4. The value $P_n$ obtained is loaded into an accumulator register 16 and the value $V_n$ is loaded into an accumulator register 17. At each period of the clock signal given by the clock 11, the value $a_n$ is added to the contents of the accumulator register 16 and the contents of the accumulator the register 17 are added to the contents of accumulator register 16 by an adder 19.

The contents of the accumulator register the correspond to the slope $P_n$ of the audio signal and the contents of the accumulator register 17 correspond to the value $V_n$ of the audio signal.

The two values $P_n$ and $V_n$ are used for the addressing of the memory 10 of FIG. 3 which contains either pre-corrected values of the audio signal or a word that enables the production of a command corresponding to the values $P_n$ and $V_n$.

The memory 10 can also be addressed by other parameters such as the frequency of the RF signal or its mean power inasmuch as these parameters may be used to improve the performance characteristics in terms of distortion.

The values obtained at output of the memory 10 are transmitted to the command determining device at the frequency Fint of the clock 11 which may be very high as compared with the switch-over frequency of the modules so as not to cause the appearance of inconvenient lines in the signal at the output of the transmitter.

Figure 5:
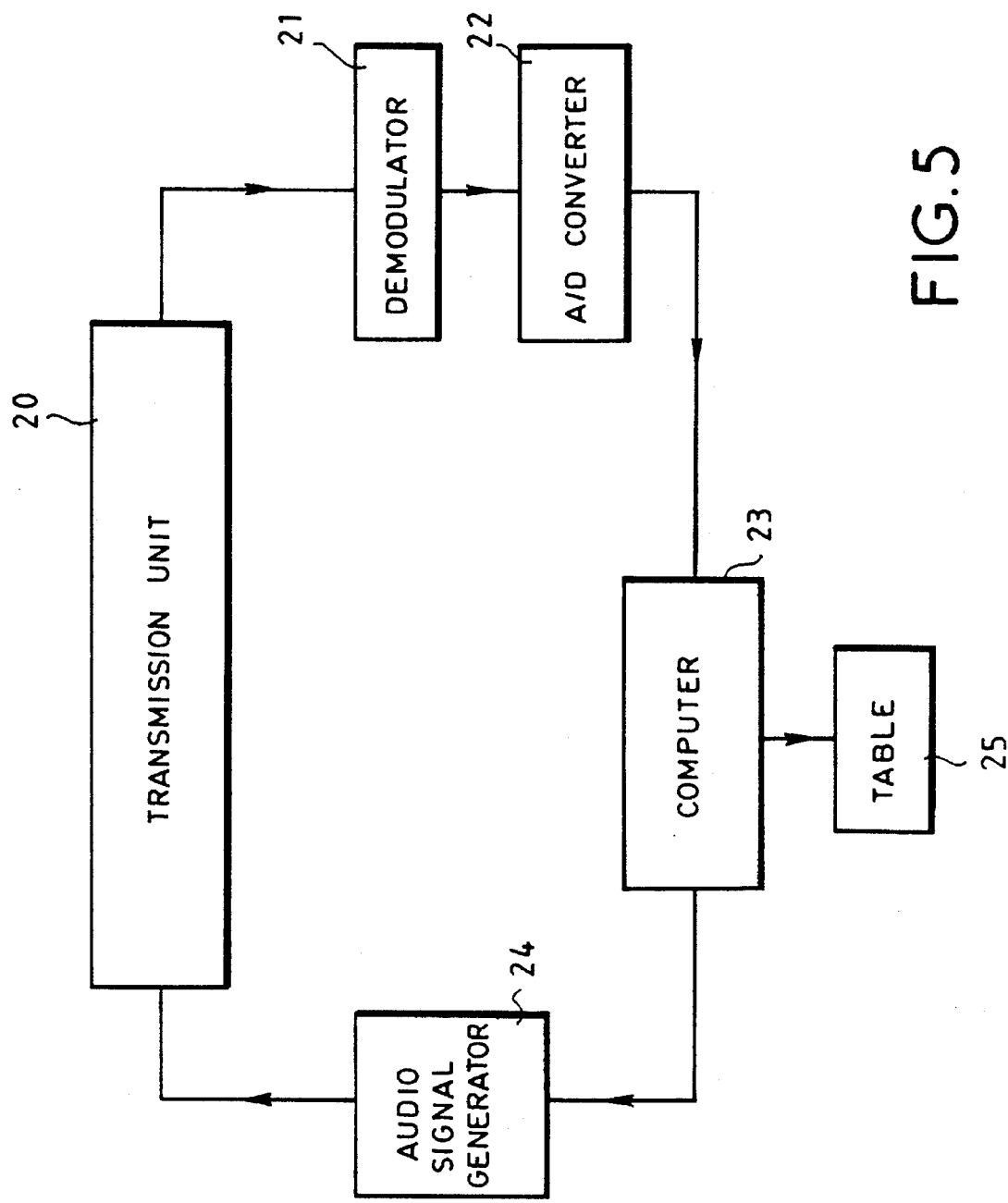
FIG. 5 shows a mode of generation of the pre-correction values applied to the device of FIG. 4.

The memory 10 is made by means of large-sized programmable read-only memories. The pre-corrected values that are recorded in a memory 10 may be obtained by means of a measuring stand of a type equivalent to the one shown in FIG. 5. The transmission unit that is shown in the block 20 of FIG. 5 is connected at its output to a demodulator 21 coupled to an analog-digital converter 22. The output of the analog-digital converter 22 is connected to a computer 23 which controls an audio signal generator 24 that has the task of giving an audio signal to the input of the transmission unit 20. The analysis of the signal thus acquired at output of the transmission unit by the computer 23, with the signal delivered by the audio signal generator 24 being known, enables the construction of a correction table 25 that can be thereafter placed in the memory 10 of FIG. 3.

Obviously, numerous modifications and variations of the present invention are possible in light of the above teachings. It is therefore to be understood that, within the scope of the appended claims, the invention may be practiced otherwise than as specifically described herein.

What is claimed is:

1. A device for processing and pre-correcting an audio signal prior to amplifying said audio signal in an amplification system of a transmitter using amplitude modulation, said amplification system having a determined number of modules which are series-connected to an input of a low pass filter and which generate pulse of modulated width, said device comprising:

an analog-digital converter for converting said audio signal to be transmitted into digital samples;

an interpolation circuit, coupled to said analog-digital converter, for computing a slope of said audio signal by linear interpolation and a value of said audio signal by parabolic interpolation;

memory means, coupled to said interpolation circuit, for storing pre-correction values of said digital samples of said audio signal which are addressable by said values of said audio signal computed by said interpolation circuit; and a measuring stand which includes a transmission unit of said transmitter coupled to a computer which analyzes a signal output from said transmission unit and compares said signal with a corresponding signal that has been supplied to an input of said transmission unit to construct a corresponding table of pre-correction values which is recorded in said memory means.

2. A device according to claim 1, wherein said interpolation circuit computes:

a mean value $V_n$ of an amplitude of said audio signal between a value of a current digital sample and a value of an immediately preceding digital sample;

a difference value $P_n$ between said value of said current digital sample $U_n$ and said value of said immediately preceding digital sample; and for the duration of each sampling period, a first sequence of N difference values $P_n$ and a second sequence of N mean values $V_n$, said first sequence corresponding to a linear interpolation of said slope of said audio signal and said second sequence corresponding to a parabolic interpolation of said value of said audio signal, n and N being integers.

3. A device according to claim 2, wherein said interpolation circuit comprises:

a first device for computing said difference value $P_n$;

a second device for computing said mean value $V_n$;

a third device for computing an increment value $a_n$ such that, between three successive digital samples $U_{n-2}$, $U_{n-1}$, and $U_n$, the following relationships are verified $$P_{n+1} = P_n + N \cdot a_n,$$

and $$V_n = V_{n-1} + N \cdot P_n + (N-1) \cdot N/2 \cdot a_n,$$

where N is a whole number of time intervals of each sampling period;

a first accumulator register for incrementing, during each sampling period, said first sequence of values $P_n$ according to the relationship $$P_n(i) = P_n + i \cdot a_n,$$

where i varies from 1 to N; and a second accumulator register for incrementing, during each sampling period, said second sequence of values $V_n$ according to the relationship $$V_n = V_n + i \cdot P_n + (i-1) \cdot i/2 \cdot a_n,$$

where i varies from 1 to N.

4. A device according to claim 3, wherein outputs of said first and second accumulator registers are connected to addressing inputs of said memory means.

* * * * *